(12) United States Patent
Racz (10) Patent No.: US 9,176,170 B2
(45) Date of Patent: Nov. 3, 2015

(54) CURRENT SENSOR

(75) Inventor: Robert Racz, Zug (CH)

(73) Assignee: Melexis Technologies NV, Tessenderlo (BE)

( * ) Notice: Subject to any disclaimer, the term of this patent is extended or adjusted under 35 U.S.C. 154(b) by 692 days.

(21) Appl. No.: 13/249,444

(22) Filed: Sep. 30, 2011

(65) Prior Publication Data

US 2012/0081110 A1 Apr. 5, 2012

(30) Foreign Application Priority Data

Oct. 1, 2010 (CH) ........................................ 1602/10

(51) Int. Cl.
*G01R 33/06* (2006.01)
*G01R 15/20* (2006.01)
*G01R 33/07* (2006.01)
*G01R 15/18* (2006.01)
*G01R 19/20* (2006.01)

(52) U.S. Cl.
CPC ............ *G01R 15/202* (2013.01); *G01R 15/207* (2013.01); *G01R 15/185* (2013.01); *G01R 19/20* (2013.01)

(58) Field of Classification Search
CPC ...................................................... G01R 33/07
See application file for complete search history.

(56) References Cited

U.S. PATENT DOCUMENTS

| 5,041,780 | A | 8/1991 | Rippel |
| 6,184,679 | B1 * | 2/2001 | Popovic et al. ................ 324/251 |
| 6,356,068 | B1 * | 3/2002 | Steiner et al. .............. 324/117 H |
| 7,129,691 | B2 | 10/2006 | Shibahara et al. |
| 7,259,545 | B2 * | 8/2007 | Stauth et al. ............... 324/117 R |
| 7,298,133 | B2 * | 11/2007 | Hastings et al. .......... 324/117 H |
| 7,375,507 | B2 | 5/2008 | Racz et al. |
| 7,545,136 | B2 | 6/2009 | Racz et al. |
| 7,709,754 | B2 * | 5/2010 | Doogue et al. ................. 174/528 |
| 7,898,240 | B2 * | 3/2011 | Shibahara et al. ......... 324/117 R |

(Continued)

FOREIGN PATENT DOCUMENTS

| DE | 4410180 A1 | 9/1995 |
| JP | 200531000 A | 2/2005 |

(Continued)

OTHER PUBLICATIONS

European Search Report for EP 11 18 1474 dated Jun. 11, 2013.

(Continued)

*Primary Examiner* — Patrick Assouad
*Assistant Examiner* — Hoang X Nguyen
(74) *Attorney, Agent, or Firm* — McCormick, Paulding & Huber, LLP (57) ABSTRACT

A current sensor comprises a flat housing made of plastic having an underside and an upper side and electrical connections, a current conductor through which the current to be measured flows, and a semiconductor chip having two magnetic field sensors, wherein the component of the magnetic field detected by the two magnetic field sensors points in opposite directions at the locations of the two magnetic field sensors. The semiconductor chip is connected as flipchip to the electrical connections. The current conductor extends from one side wall to the opposite side wall of the housing, is embedded flat in the underside of the housing and is therefore exposed on the underside of the housing. The opposing surfaces of the semiconductor chip and the current conductor are separated by an electrical insulation layer.

21 Claims, 5 Drawing Sheets

(56) References Cited

U.S. PATENT DOCUMENTS

| | | | |
|---|---|---|---|
| 8,442,787 B2 * | 5/2013 | Ausserlechner et al. | 702/64 |
| 2006/0033487 A1 | 2/2006 | Nagano et al. | |
| 2006/0219436 A1 | 10/2006 | Taylor et al. | |
| 2008/0250847 A1 * | 10/2008 | Kitani et al. | 73/31.05 |
| 2010/0156394 A1 | 6/2010 | Ausserlechner et al. | |

FOREIGN PATENT DOCUMENTS

| | | | |
|---|---|---|---|
| WO | 2004072672 A1 | 8/2004 | |
| WO | 2005026749 A1 | 3/2005 | |
| WO | 2006083479 A1 | 8/2006 | |
| WO | 2006130393 A1 | 12/2006 | |
| WO | 2009148823 A1 | 12/2009 | |

OTHER PUBLICATIONS

Robert Racz, et al., "Electronic Compass Sensor", Proceedings of the IEEE Sensors 2004 (IEE Cat. 04CH37603) 2004 IEEE Piscataway, NJ, USA, vol. 3, p. 1446-1449 vol. 3, Dec. 31, 2004, ISBN 0-7.8. 2003-8692-2.

* cited by examiner

CURRENT SENSOR

PRIORITY CLAIM

Applicant hereby claims foreign priority under 35 U.S.C. §119 from Swiss Application No. 1602/10 filed Oct. 1, 2010, the disclosure of which is herein incorporated by reference.

FIELD OF THE INVENTION

The invention relates to a current sensor and a device for measuring current using such a current sensor.

BACKGROUND OF THE INVENTION

Current sensors exist in many designs and variants. Current sensors which detect the magnetic field generated by the current, which are packaged in a conventional IC housing and in which current conductors through which the current to be measured flows are passed through the housing are known, for example, from U.S. Pat. No. 7,129,691, international patent applications WO 2005026749 and WO 2006130393 and US patent application US 2010156394.

Since the current conductor guided through the housing has a relatively small cross-section and an even further reduced cross-section in the area of the magnetic field sensors, in order to locally increase the current density and therefore the magnetic field there, the heat produced by the power loss in the current conductor leads to heating of the current sensor which brings about undesirable drift fluctuations of the magnetic field sensors.

The invention is based on the object of developing a current sensor which requires little space, is cost-effective to manufacture and does not show the mentioned disadvantages.

BRIEF DESCRIPTION OF THE DRAWING FIGURES

The accompanying drawings, which are incorporated into and constitute a part of this specification, illustrate one or more embodiments of the present invention and, together with the detailed description, serve to explain the principles and implementations of the invention. The figures are not drawn to scale.

In the drawings.

DETAILED DESCRIPTION OF THE PREFERRED EMBODIMENTS

Figure 1:
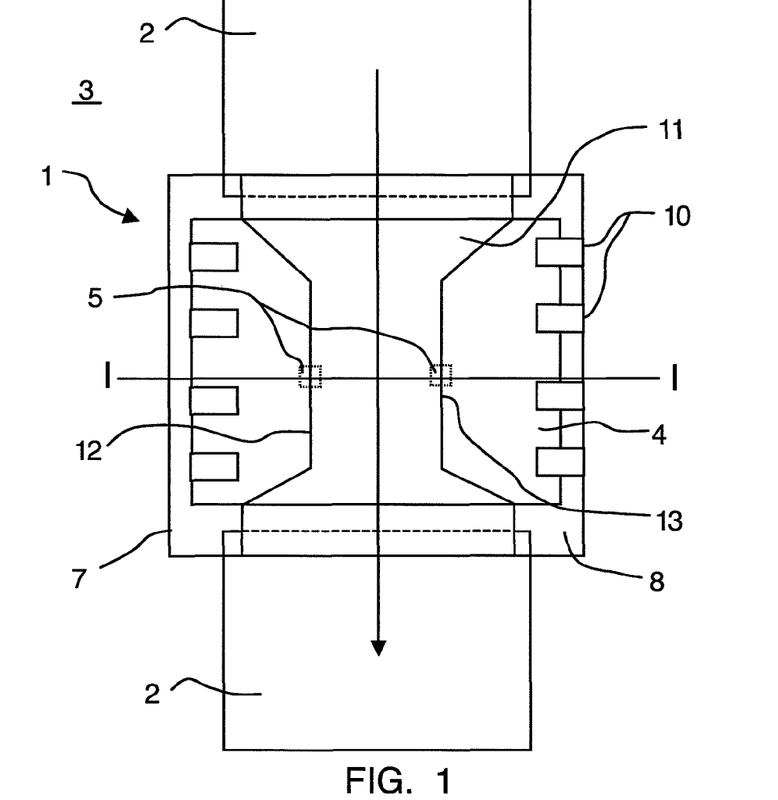
FIG. 1 shows in plan view a current sensor according to a first exemplary embodiment, which is mounted on an interrupted conductor path of a printed circuit board.
Figure 2:
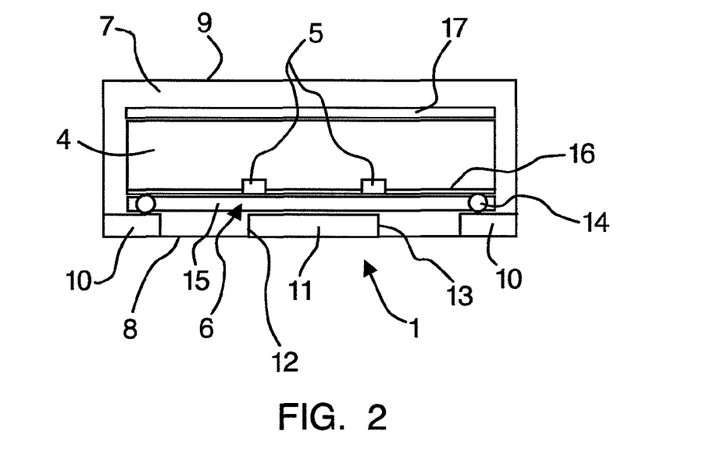
FIG. 2 shows a current sensor in cross-section along the line I-I in FIG. 1.

FIG. 1 shows in plan view a current sensor 1 according to the invention, which in this example is mounted on an interrupted conductor path 2 of a printed circuit board 3 (whose outline is not indicated here). FIG. 2 shows the current sensor 1 in a section along the line I-I in FIG. 1. To make them easier to understand, the individual elements are not shown to scale in these figures. The current sensor 1 can be mounted also on an uninterrupted continuous conductor path 2 of the printed circuit board 3 or an arbitrary current conductor and acts in this case as a shunt, which enables the measurement of larger currents. The current sensor 1 comprises a semiconductor chip 4 having two magnetic field sensors 5 and electronic circuits for operation of the magnetic field sensors 5. The magnetic field sensors 5 are integrated into the active surface 6 of the semiconductor chip 4 or arranged on the surface 6 of the semiconductor chip 4.

The current sensor 1 further comprises a flat housing 7 made of plastic having an underside 8 and an upper side 9 which lie opposite one another, and four side walls. The underside 8 contains at least three electrical connections 10 and a flat current conductor 11, of which at least the current conductor 11, preferably also the electrical connections 10, are embedded flat in the underside 8 of the housing 7 and are exposed on the underside 8 of the housing 7. The current conductor extends as far as two mutually opposite side walls of the housing 7 and is advantageously tapered in the area of the magnetic field sensors 5 and/or provided with slots running orthogonally to the current direction, above which the magnetic field sensors 5 are disposed. The electrical connections 10 are disposed along the two other side walls. The housing 7 is a plastic casing produced by encapsulating, called "molding" in technical jargon. The housing 7 is soldered onto the printed circuit board 3 as a surface-mountable component, where the electrical connections 10 are connected to corresponding connections on the printed circuit board 3 and the current conductor 11 is connected to the mutually opposite ends of the conductor path 2. The length of the interruption in the conductor path 2 is determined such that the ends of the conductor path 2 and the current conductor 11 overlap and can be soldered flawlessly. The housing 7 is, for example, a so-called QFN housing. QFN is an acronym for "Quad Flat No leads package". QFN housings are also designated in professional circles as MLF or MLP housing, where MLF is an acronym for "Micro Lead Frame" and MLP is an acronym for "Micro Lead Package". The current conductor 11 and the electrical connections 10 are formed from a so-called leadframe, i.e. a structured frame made of metal, in particular copper. The current conductor 11 and the electrical connections 10 have the same thickness since they are formed from the same leadframe. The thickness of the leadframe typically amounts to 0.2 mm, but it can be enlarged, for example to 0.3 mm or 0.4 mm or more, in order to reduce the electrical resistance of the current conductor 11 and therefore also the thermal losses. The current conductor 11 and the electrical connections 10 also lie in the same plane since they are exposed on the underside 8 of the housing 7. The ends of the current conductor 11 are as wide as possible, i.e. they are approximately as wide as the width of the entirety of the electrical connections 10 accommodated on one side wall of the housing 7. There are standard QFN housings having a number m of electrical connections 10 per side wall, i.e. a total of 4*m connections per housing. In a QFN housing having m=3 electrical connections 10 per side wall, the ends of the current conductor 11 therefore extend over a width that is so large that three electrical connections 10 would have room in the same space. There are also QFN housings having n*m electrical connections 10 where n≠m, e.g. 3*4, 4*5, etc. Here the ends of the current conductor 11 are then approximately as wide as the entirety of electrical connections 10 which could be accommodated on the side wall holding the ends of the current conductor 11.

The magnetic field sensors 5 measure a component of the magnetic field that is generated by the current flowing through the conductor path 2. The direction of the current flowing through the conductor path 2 and the current sensor 1 is depicted by an arrow. The magnetic field sensors 5 are preferably magnetic field sensors that are sensitive to that component of the magnetic field that runs perpendicular to the active surface 6 of the semiconductor chip 4, for example, so-called horizontal Hall elements. The magnetic field sensors 5 are disposed in the area of the lateral edges 12 and 13 of the current conductor 11, when viewed in the direction of the current flowing through the current conductor 11, so that the component of the magnetic field detected by the magnetic field sensors 5 points in opposite directions at the locations of the two magnetic field sensors 5. The output signals of the two magnetic field sensors 5 are subtracted from one another. As a result of this difference formation, the influence of an external magnetic interfering field is largely eliminated.

The semiconductor chip 4 is connected as flipchip, i.e. having its active surface 6 pointing downwards, via so-called "solder bumps" 14 to the electrical connections 10 with the advantage that the magnetic field sensors 5 are located in the immediate vicinity of the current conductor 11 through which the current to be measured flows. The active surface 6 of the semiconductor chip 4 and the current conductor 11 are separated by an insulation layer 15 in order to achieve a certain dielectric strength against electrical voltage breakdowns. If the conductor path 2 is connected to a 230 V mains, a dielectric strength of 2.5 kV is typically required. This can be achieved, for example, by an insulation layer 15 formed from polyimide, which is 10 μm thick. The insulation layer 15 can be applied to the semiconductor chip 4, for example, before the molding or it can be formed as a so-called underfill layer during molding from the plastic material of the housing 7.

In order to achieve an efficient shielding against external electrical influences, an electrically conducting layer 16 is advantageously applied to the semiconductor chip 4, which is connected to the electrical earth of the electronic circuits. The layer 16 can contain slots and/or recesses/openings in order to reduce the formation of eddy currents. A metallisation plane of the semiconductor chip 4 can be used for the layer 16 if a free metallisation plane not required otherwise is available. If this is not the case, the layer 16 can be applied to the surface 6 of the semiconductor chip 4 with suitable recesses/openings for the electrical contacts to the connections 10.

In order to strengthen the magnetic field generated by the current flowing through the current conductor 11 and as shield against external magnetic fields, a layer 17 of ferromagnetic material whose relative permeability is at least 1000 is advantageously applied to the rear side of the semiconductor chip 4. The layer 17 can be applied to the rear side of the wafer during fabrication of the semiconductor chip 4, for example, by electroplating or in the form of a film. The layer 16 must be sufficiently thick that it does not magnetically reach saturation due to the magnetic field produced by the maximum current flowing through the current conductor 11. A layer thickness of several 10 μm is usually sufficient to achieve this.

The current sensor 1 according to the invention is a surface-mountable component that differs from conventional current sensors in IC housings in that the current conductor 11 through which the current to be measured flows, is exposed on an outer side of the housing 7, here the underside 8. This enables the heat loss generated by the current in the current conductor 11 to be efficiently released to the environment.

Figure 3:
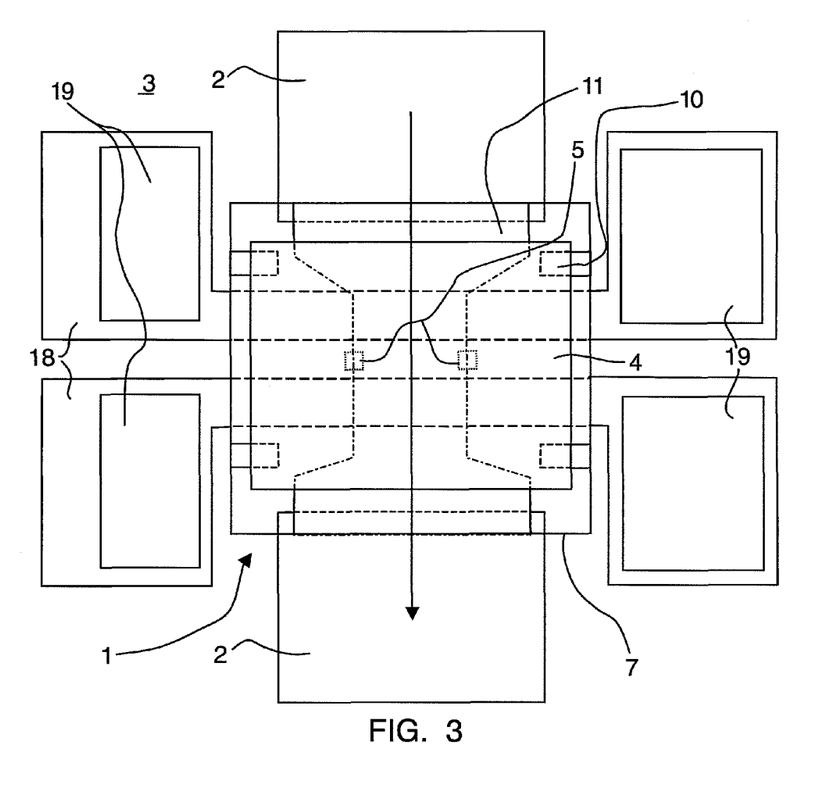
FIG. 3 shows in plan view another printed circuit board and a current sensor mounted thereon.

As already mentioned, the current sensor 1 can be used to measure the current flowing through the conductor path 2 of a printed circuit board 3. The current conductor 11 of the current sensor 1 then connects the ends of the interrupted conductor path 11. The printed circuit board 3 and the current sensor 1 then together form a device for measuring current. FIG. 3 shows in plan view an exemplary embodiment of a printed circuit board 3 (its outline is again not shown here) which has one or more metal surfaces 18 which, according to the exemplary embodiment shown here, are soldered to the current conductor 11 of the current sensor 1 during assembly of the current sensor 1. The surfaces 18 can alternatively or additionally also be connected directly to the opposite ends of the conductor path 2. The surfaces 18 extend laterally beyond the housing 7 of the current sensor 1 and are electrically free-floating. The surfaces 18 serve to transfer the heat loss produced in the current conductor 11 more efficiently to the environment. The geometrical shape of the surfaces 18 is configured so that the surfaces 18 do not produce a bypass through which some of the current could flow so that the entire current flows through the section of the current conductor 11 in which the two magnetic field sensors 5 are placed. The conductor paths of the printed circuit board 3 which contact the electrical connections 10 of the current sensor 1 are not shown for reasons of diagrammatic clarity. The surfaces 18 are preferably disposed on the side of the printed circuit board 3 facing the current sensor 1, i.e. its upper side, but they can also be disposed on the underside of the printed circuit board 3 and be configured with vias for direct soldering to the current conductor 11.

In the exemplary embodiment shown in FIG. 3, only four electrical connections 10 are provided and the surfaces 18 and the connections 10 do not overlap. If, as in the exemplary embodiment shown in FIG. 1, the connections 10 require a relatively large amount of space, the surfaces 18 can then also be configured such that they overlap with some or all of the connections 10. In this case, the surfaces 18 are provided with recesses which keep the connections 10 free so that during mounting of the current sensor 1 on the printed circuit board 3, no electrical contact occurs between the surfaces 18 and the connections 10. Furthermore, in this case, the printed circuit board 3 must contain at least two metallisation planes.

When assembling the printed circuit board 3, a surface-mountable component 19 can be applied to the surfaces 18 which further improves the removal of heat as a result of its three-dimensional shape. The component 19 can be a heat sink, a ferrite component or a resistor or a capacitor. A ferrite component additionally acts as a shield which shields the current sensor 1 from external magnetic fields. At least one contact of the capacitor or of the resistor is soldered to the surface 18.

Figure 4:
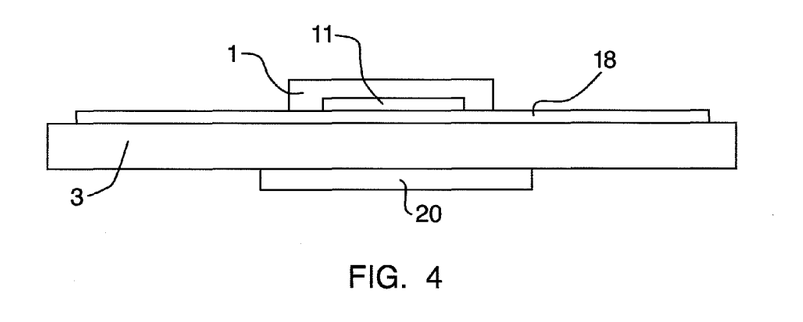
FIG. 4 shows a device for current measurement comprising a printed circuit board and a current sensor mounted thereon in cross-section.

FIG. 4 shows in cross-section a device for measuring current in which a magnetic shielding 20 is mounted on the printed circuit board 3 on the side facing away from the current sensor 1. The shielding 20 consists, for example, of ferrite and is preferably also formed as a surface-mountable component. The shielding 20 additionally amplifies the output signals of the magnetic field sensors 5.

Figure 5:
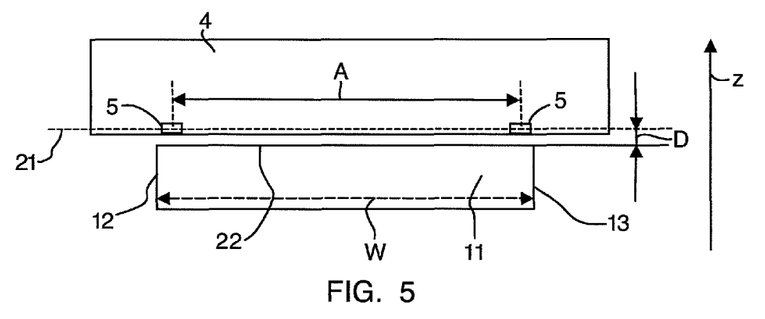
FIG. 5 shows a current conductor and magnetic field sensors of the current sensor in cross-section.
Figure 6:
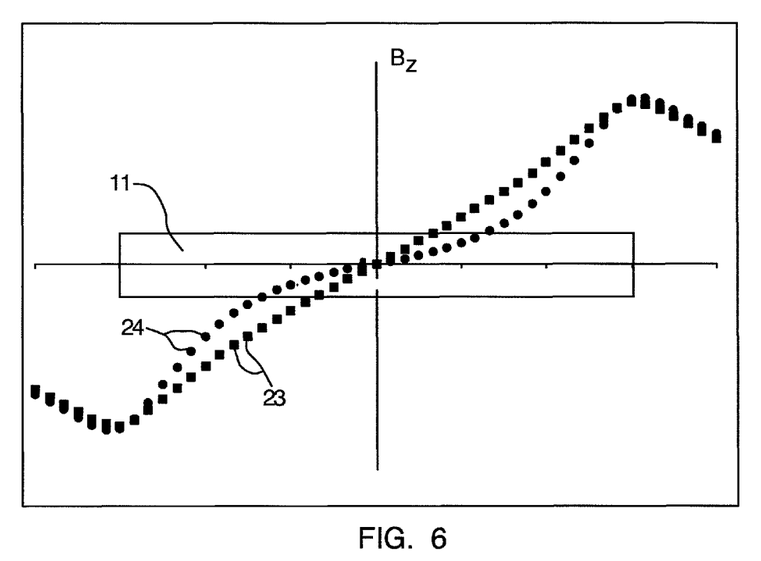
FIG. 6 shows a diagram with simulation results.

The spatial profile, i.e. intensity and direction, of the magnetic field generated by the current flowing through the current conductor 11 is dependent on the frequency of the current. FIG. 5 shows the current conductor 11 and the semiconductor chip 4 with the two magnetic field sensors 5 according to the structure in FIG. 1 in cross-section. FIG. 6 shows the intensity of the component $B_z$ of the magnetic field running perpendicular to the active surface 6 of the semiconductor chip 4 in a plane 21 running at a distance D parallel to the flat side 22 of the current conductor 11 facing the semiconductor chip 4, which was calculated for a current conductor 11 having a width W=1.5 mm and a distance D=0.3 mm. The square points 23 illustrate the intensity of the component $B_z$ of the magnetic field generated by a direct current. The round points 24 illustrate the intensity of the component $B_z$ of the magnetic field generated by an alternating current having a frequency of 100 kHz. The position of the lateral edges 12 and 13 of the current conductor 11 is shown by dashed lines. The position of the current conductor 11 is also indicated. The following criteria for the positioning of the magnetic field sensors 5 in relation to the current conductor 11 are obtained from this diagram:

a) The frequency dependence of the magnetic field sensors 5 is smallest when the two magnetic field sensors 5 are disposed below the side edges 12 and 13 of the current conductor 11.

b) The sensitivity of the difference signal formed from the two magnetic field sensors 5 in relation to a displacement of the semiconductor chip 4 from its desired position in the x-direction is lowest when the two magnetic field sensors 5 are placed where the variation in the intensity of the component $B_z$ of the magnetic field has a linear profile as far as possible at least piecewise. This is the case when the two magnetic field sensors 5 are disposed in the area between the lateral edges 12 and 13 of the current conductor 11.

Since the current conductor 11 is typically formed from a stamped metal frame, its width is subject to certain manufacture-dependent fluctuations which can lie in the range of about 10 μm to 100 μm.

It therefore follows from these criteria that the magnetic field sensors 5 are advantageously placed on the semiconductor chip 4 such that for the most part they are located in the area above the lateral edge 12 or 13 and on the inner side of the respective lateral edge, i.e. on the side of the respective lateral edge facing the centre of the current conductor 11. The horizontal Hall elements preferably used as magnetic field sensors 5 are typically square or cross-shaped and have a centre of symmetry given by their shape. The optimum distance of the magnetic field sensors 5 can therefore be characterised in that the distance A between the centres of symmetry of the two magnetic field sensors 5 lies in the range of $0.9*W \leq A \leq W$, where W designates the width of the current conductor 11 in the area of the magnetic field sensors 5.

Figure 7:
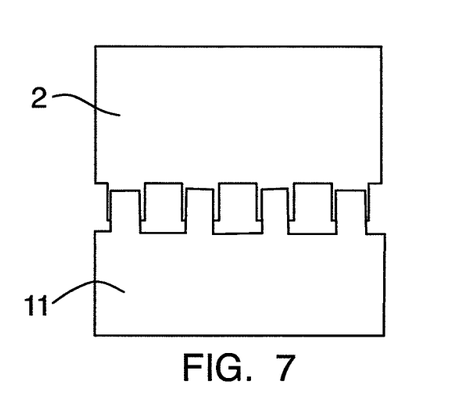
FIG. 7 shows in plan view a detail of the current conductor of the current sensor and the conductor paths of the printed circuit board.

FIG. 7 shows in plan view the one end of the conductor path 2 that overlaps with the one end of the current conductor 11 according to a preferred embodiment. The two ends are tooth-shaped so that when soldering the current sensor 1 to the printed circuit board 3, clean soldered joints are formed.

Figure 8:
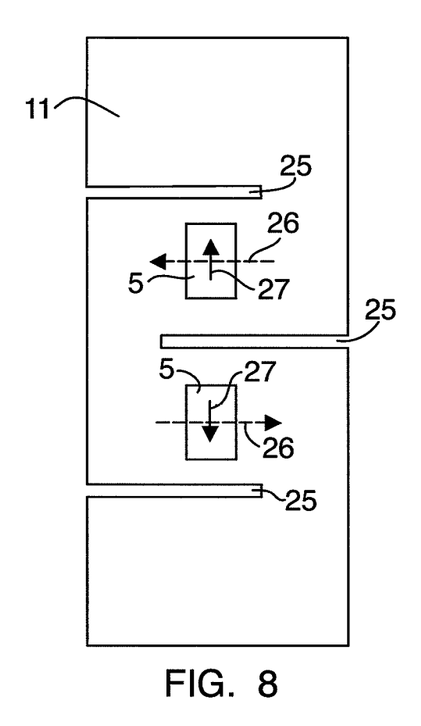
FIG. 8 shows in plan view the current conductor of a current sensor according to a further exemplary embodiment.

Instead of magnetic field sensors that are sensitive to the component of the magnetic field running perpendicular to the active surface of the semiconductor chip 4, magnetic field sensors can also be used which are sensitive to the component of the magnetic field running parallel to the active surface of the semiconductor chip 4, for example, AMR sensors, GMR sensors, so-called vertical Hall elements etc. In order that two such magnetic field sensors 5 can be used for a differential measurement, the current conductor 11 must be configured so that the current flows in the area of the two magnetic field sensors 5 in mutually opposite directions and thus the magnetic field at the locations of the two magnetic field sensors 5 points in mutually opposite directions. A current conductor 11 which satisfies this condition is, for example, an s-shaped current conductor as shown in FIG. 8. The s-shape is obtained by three slots 25. The local direction of the current at the locations of the magnetic field sensors 5 is shown by arrows 26 to illustrate this situation. The direction of the magnetic field at the locations of the magnetic field sensors 5 is shown by arrows 27.

Figure 9:
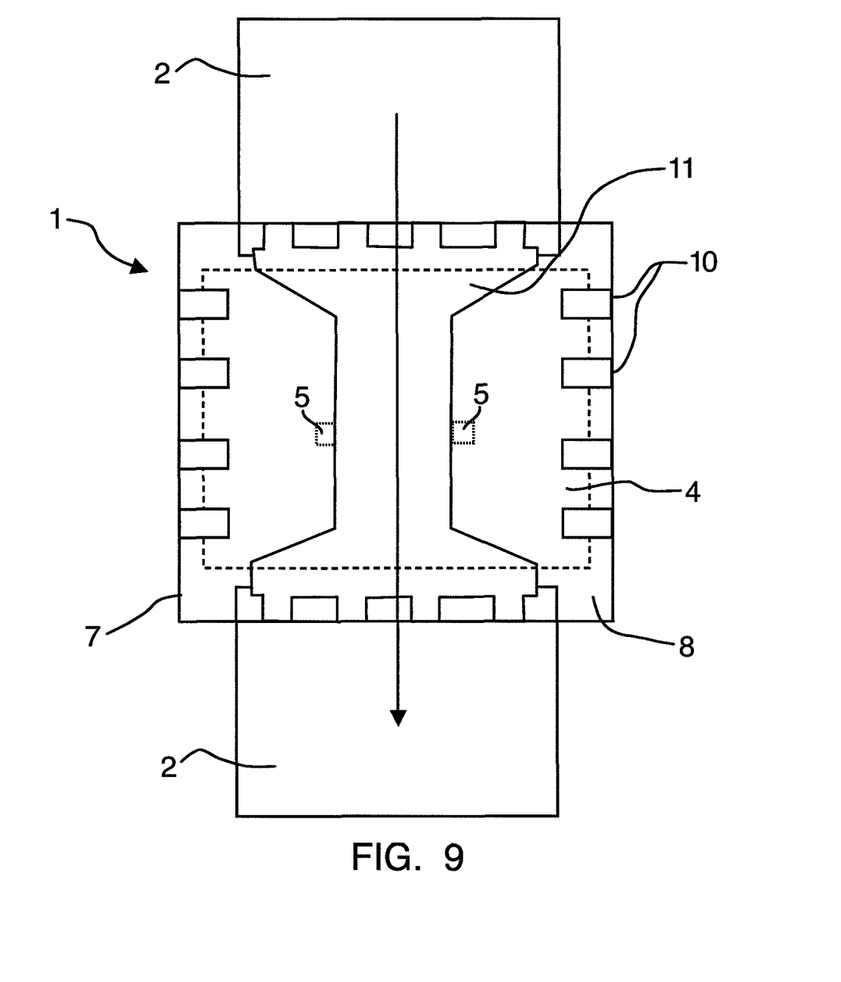
FIG. 9 shows the current sensor of FIG. 1 with another embodiment of the current conductor.

In the exemplary embodiments shown in FIGS. 1 and 3, at its opposite ends at which it is in contact with the conductor path 2, the current conductor 11 is configured as a continuous contact strip which, as far as is possible from the production technology viewpoint, extends completely or at least predominantly over the entire width of the housing 7. FIG. 9 shows another exemplary embodiment in which, at its opposite ends at which it is in contact with the conductor path 2, the current conductor 11 is configured with connecting fingers which are configured in the same way as the electrical connections 10. This allows the current sensor to be fabricated in a way which requires no adaptations to the technology.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims and their equivalents.

What is claimed is:

1. A current sensor, comprising
   a flat housing made of plastic having an underside, an upper side and four side walls, electrical connections and a current conductor through which the current to be measured flows, and
   a semiconductor chip having two magnetic field sensors, wherein the component of the magnetic field detected by the two magnetic field sensors points in opposite directions at the locations of the two magnetic field sensors, wherein the semiconductor chip is connected as flipchip to the electrical connections, wherein
   the current conductor extends from one side wall to the opposite side wall of the housing, is embedded flat in the underside of the housing such that a side of the conductor is flush with the underside of the housing and such that the side of the conductor that is flush with the underside of the housing is exposed to the outside of the housing through the underside of the housing,
   the mutually opposite ends of the current conductor substantially have the same width as the entirety of the electrical contacts that would have room at a side wall of the housing accommodating an end of the current conductor, and
   the opposing surfaces of the semiconductor chip and the current conductor are separated by an electrical insulation layer.

2. The current sensor according to claim 1, wherein the magnetic field sensors are disposed in the area of the two lateral edges of the current conductor, wherein a distance A between centres of symmetry of the magnetic field sensors lies in the range of $0.9*W \leq A \leq W$, where W designates the width of the current conductor in the area of the magnetic field sensors.

3. The current sensor according to claim 1, wherein the electrical connections are integrated flat in the underside of the housing.

4. The current sensor according to claim 2, wherein the electrical connections are integrated flat in the underside of the housing.

5. The current sensor according to claim 1, wherein a rear side of the semiconductor chip is coated with a ferromagnetic layer.

6. The current sensor according to claim 2, wherein a rear side of the semiconductor chip is coated with a ferromagnetic layer.

7. The current sensor according to claim 3, wherein a rear side of the semiconductor chip is coated with a ferromagnetic layer.

8. The current sensor according to claim 4, wherein a rear side of the semiconductor chip is coated with a ferromagnetic layer.

9. A device for measuring current, comprising
a printed circuit board having a conductor path, and
a current sensor for measurement of the current flowing in the conductor path, wherein
the current sensor comprises
a flat housing made of plastic having an underside, an upper side and four side walls, electrical connections and a current conductor through which the current to be measured flows, and
a semiconductor chip having two magnetic field sensors, wherein the component of the magnetic field detected by the two magnetic field sensors points in opposite directions at the locations of the two magnetic field sensors, wherein the semiconductor chip is connected as flipchip to the electrical connections, wherein
the current conductor extends from one side wall to the opposite side wall of the housing, is embedded flat in the underside of the housing such that a side of the conductor is flush with the underside of the housing and such that the side of the conductor that is flush with the underside of the housing is exposed to the outside of the housing through the underside of the housing,
the mutually opposite ends of the current conductor substantially have the same width as the entirety of the electrical contacts that would have room at a side wall of the housing accommodating an end of the current conductor, and
the opposing surfaces of the semiconductor chip and the current conductor are separated by an electrical insulation layer, and wherein
the conductor path is interrupted at a predetermined point, the printed circuit board has at least one metallic, electrically free-floating surface which is either soldered to the current conductor of the current sensor and/or is connected to the conductor path.

10. The device according to claim 9, wherein the electrical connections are integrated flat in the underside of the housing.

11. The device according to claim 10, wherein a surface-mountable component is mounted on at least one of said at least one metallic surface.

12. The device according to claim 10, wherein a magnetic shielding is mounted on the printed circuit board on the side facing away from the current sensor.

13. The device according to claim 11, wherein a magnetic shielding is mounted on the printed circuit board on the side facing away from the current sensor.

14. A current sensor, comprising
a flat housing made of plastic having an underside, an upper side and four side walls, electrical connections and a current conductor through which the current to be measured flows, and
a semiconductor chip having two magnetic field sensors, wherein the component of the magnetic field detected by the two magnetic field sensors points in opposite directions at the locations of the two magnetic field sensors, wherein the semiconductor chip is connected as flipchip to the electrical connections, wherein
the current conductor extends from one side wall to the opposite side wall of the housing, is embedded flat in the underside of the housing and is exposed to the outside of the housing through the underside of the housing,
the mutually opposite ends of the current conductor substantially have the same width as the entirety of the electrical contacts that would have room at a side wall of the housing accommodating an end of the current conductor, and
the opposing surfaces of the semiconductor chip and the current conductor are separated by an electrical insulation layer.

15. The current sensor according to claim 14, wherein the magnetic field sensors are disposed in the area of the two lateral edges of the current conductor, wherein a distance A between centres of symmetry of the magnetic field sensors lies in the range of $0.9*W \leq A \leq W$, where W designates the width of the current conductor in the area of the magnetic field sensors.

16. The current sensor according to claim 14, wherein the electrical connections are integrated flat in the underside of the housing.

17. The current sensor according to claim 15, wherein the electrical connections are integrated flat in the underside of the housing.

18. The current sensor according to claim 14, wherein a rear side of the semiconductor chip is coated with a ferromagnetic layer.

19. The current sensor according to claim 15, wherein a rear side of the semiconductor chip is coated with a ferromagnetic layer.

20. The current sensor according to claim 16, wherein a rear side of the semiconductor chip is coated with a ferromagnetic layer.

21. The current sensor according to claim 17, wherein a rear side of the semiconductor chip is coated with a ferromagnetic layer.

* * * * *